United States Patent
Li et al.

(10) Patent No.: US 10,132,878 B2
(45) Date of Patent: Nov. 20, 2018

(54) MAGNETO-IMPEDANCE SENSING DEVICE METHOD AND MANUFACTURING METHOD THEREOF

(71) Applicant: PROLIFIC TECHNOLOGY INC., Taipei (TW)

(72) Inventors: Hung-Ta Li, Kaohsiung (TW); Po-Feng Lee, Hsinchu (TW)

(73) Assignee: PROLIFIC TECHNOLOGY INC., Taipei (TW)

( * ) Notice: Subject to any disclaimer, the term of this patent is extended or adjusted under 35 U.S.C. 154(b) by 10 days.

(21) Appl. No.: 15/261,114

(22) Filed: Sep. 9, 2016

(65) Prior Publication Data

US 2017/0074951 A1  Mar. 16, 2017

(30) Foreign Application Priority Data

Sep. 10, 2015  (TW) .............................. 104129966 A

(51) Int. Cl.
*G01R 33/06* (2006.01)
*G01R 27/26* (2006.01)
*G01R 33/00* (2006.01)

(52) U.S. Cl.
CPC ........ *G01R 33/063* (2013.01); *G01R 27/2611* (2013.01); *G01R 33/0005* (2013.01); *G01R 33/0052* (2013.01)

(58) Field of Classification Search
CPC ............ G01R 27/2611; G01R 33/0052; G01R 33/0005
See application file for complete search history.

(56) References Cited

U.S. PATENT DOCUMENTS 7,224,161 B2    5/2007 Honkura et al.
8,350,565 B2 *  1/2013 Honkura .............. G01R 33/063
                                            324/200
(Continued)

FOREIGN PATENT DOCUMENTS

CN    1533506 A    9/2004
CN    1533613 A    9/2004
(Continued)

OTHER PUBLICATIONS

Chinese Office Action dated Jul. 4, 2018.

*Primary Examiner* — Thang Le
*Assistant Examiner* — Alvaro Fortich
(74) *Attorney, Agent, or Firm* — Rabin & Berdo, P.C.

(57) ABSTRACT

An electromagnetic impedance sensing device includes a substrate, a first patterned conductive layer, a second patterned conductive layer, a magneto-conductive wire and an encapsulation layer. The substrate has a surface and a trench extending into thereof. The first patterned conductive layer is formed on the surface, as well as a bottom and sidewalls of the trench. The magneto-conductive wire is disposed in the trench. The second patterned conductive layer extending across the trench and electrically in contact with the first patterned conductive layer is formed on the first patterned conductive layer to make the magneto-conductive wire sandwiched between the first and the second patterned conductive layers. The magneto-conductive wire is encapsulated by the encapsulation layer to make the magneto-conductive wire electrically isolated from the first and second patterned conductive layers. At least one coil circuit surrounding the magneto-conductive wire is formed by the first and second patterned conductive layers.

7 Claims, 5 Drawing Sheets

(56) References Cited

U.S. PATENT DOCUMENTS

| | | | |
|---|---|---|---|
| 8,378,670 B1 | 2/2013 | Honkura et al. | |
| 8,461,834 B2 | 6/2013 | Honkura et al. | |
| 2003/0052671 A1* | 3/2003 | Kawase | G01C 17/30 324/249 |
| 2006/0022354 A1* | 2/2006 | Anzai | H01L 23/3114 257/786 |
| 2012/0112362 A1* | 5/2012 | Shin | H01L 23/5226 257/774 |
| 2012/0115303 A1* | 5/2012 | Gambino | H01L 21/76802 438/399 |
| 2014/0104027 A1* | 4/2014 | Ahn | H01F 27/2804 336/200 |
| 2014/0191829 A1* | 7/2014 | Chiba | G01R 33/04 335/299 |
| 2015/0179582 A1* | 6/2015 | Baek | H01L 23/53238 257/751 |
| 2015/0232984 A1* | 8/2015 | Yamamoto | C23C 16/045 216/12 |

FOREIGN PATENT DOCUMENTS

| | | |
|---|---|---|
| CN | 101815953 A | 8/2010 |
| CN | 102334040 A | 1/2012 |

\* cited by examiner

MAGNETO-IMPEDANCE SENSING DEVICE METHOD AND MANUFACTURING METHOD THEREOF

This application claims the benefit of Taiwan application Serial No. 104129966, filed Sep. 10, 2015, the disclosure of which is incorporated by reference herein in its entirety.

TECHNICAL FIELD

The disclosure relates in general to a semiconductor element and manufacturing method thereof, and more particularly to an electromagnetic impedance sensing device and a manufacturing method thereof.

BACKGROUND

As consumer electronics, such as mobile phones and electronic compasses, and conventional products, such as motors and brakes, become more and more poplar, the demand for electromagnetic impedance sensing devices becomes ever increasing.

Currently, most electromagnetic impedance sensing devices use ceramic substrate as the base. A magneto-conductive wire is fixed on the ceramic substrate by alternatively stacking a at least two patterned conductive layers, a patterned insulating layer and the magneto-conductive wire, and an induction coil circuit made of the magneto-conductive wire surrounded by the patterned conductive layers and the patterned insulating layer is formed. However, during the forming of the induction coil circuit, each process either for forming the patterned conductive layers or for forming the patterned insulating layer should include an individual alignment step to make the resulted structure align with the magneto-conductive wire, and the manufacturing process is thus very time consuming. Furthermore, since the magneto-conductive wire is hard to fix and there may exist a step height between the magneto-conductive wire and the ceramic substrate, thus it is difficult to uniformly coat the photoresists used for patterning the conductive layers and the insulating layer. Consequently, defocus problems in the photolithography process may arise, and the yield of the process can be deteriorated. Since the conductive layer and the insulating layer fluctuate with the shape of the magneto-conductive wire, the subsequent step of manufacturing the electrode pads will be affected, and the critical dimension of the electromagnetic impedance sensing device becomes very difficult to be further miniaturized. Thus, the number of coils cannot be increased, and the sensitivity of the electromagnetic impedance sensing device is hard to be enhanced.

Therefore, it has become a prominent task for the industries to provide an advanced electromagnetic impedance sensing device and a manufacturing method thereof to resolve the problems encountered in the prior art.

SUMMARY

One aspect of the present disclosure relates to an electromagnetic impedance sensing device, including a substrate, a first patterned conductive layer, a second patterned conductive layer, a magneto-conductive wire and an encapsulation layer. The substrate has a surface and a trench extending into the substrate from the surface. The first patterned conductive layer is formed on the surface as well as a bottom and sidewalls of the trench. The magneto-conductive wire is disposed in the trench. The second patterned conductive layer extending across the trench and electrically in contact with the first patterned conductive layer is formed on the first patterned conductive layer to make the magneto-conductive wire sandwiched between the first patterned conductive layer and the second patterned conductive layer. The magneto-conductive wire is encapsulated by the encapsulation layer to make the magneto-conductive wire electrically isolated from the first and second patterned conductive layers, and at least one coil circuit surrounding the magneto-conductive wire is formed by the first and second patterned conductive layers.

In one embodiment of the present disclosure, the substrate is made of a semiconductor material, and an insulating layer is disposed between the substrate and the first patterned conductive layer.

In one embodiment of the present disclosure, the electromagnetic impedance sensing device further includes a dielectric layer conformally cover the first and second patterned conductive layers.

In one embodiment of the present disclosure, the electromagnetic impedance sensing device further includes a plurality of via plugs and a patterned circuit layer. The via plugs penetrate the dielectric layer to electrically contact to the magneto-conductive wire and at least one of the first and second patterned conductive layers respectively. The patterned circuit layer is formed on the dielectric layer and includes a plurality of pads electrically connected to the via plugs respectively.

In one embodiment of the present disclosure, the insulating layer fills up the trench to electrically isolate the magneto-conductive wire from the first and second patterned conductive layers respectively.

Another aspect of the present disclosure relates to a manufacturing method of an electromagnetic impedance sensing device. The method includes following steps: Firstly, a substrate is provided, wherein the substrate has a trench extending into the substrate from a surface. Next, a first patterned conductive layer is formed on the surface of the substrate as well as side walls and a bottom surface of the trench. Then, a magneto-conductive wire is disposed in the trench. Afterwards, an encapsulation layer is formed to encapsulate the magneto-conductive wire. Then, a second patterned conductive layer is formed on the first patterned conductive layer to make the second patterned conductive layer extending across the trench and electrically in contact with the first patterned conductive layer, whereby the magneto-conductive wire is sandwiched between the first patterned conductive layer and the second patterned conductive layer and at least one coil circuit surrounding the magneto-conductive wire is formed by the first patterned conductive layer and the second patterned conductive layer.

In one embodiment of the present disclosure r, before the magneto-conductive wire is disposed in the trench, the method further includes steps of filling an insulation adhesive into the trench to at least partially encapsulate the magneto-conductive wire and to electrically isolate the magneto-conductive wire from the portion of the first patterned conductive layer that is disposed on the sidewalls and the bottom surface of the trench.

In one embodiment of the present disclosure, before the second patterned conductive layer is formed, the method further includes steps of filling the trench with an insulation adhesive.

In one embodiment of the present disclosure, the substrate is made of a semiconductor material, and before the first patterned conductive layer is formed, the method further includes steps of forming an insulating layer on the substrate.

In one embodiment of the present disclosure, the method further includes steps as follows: after the coil circuit is formed, a dielectric layer is formed to conformally covering the first and second patterned conductive layers. Then, a plurality of via plugs penetrating the dielectric layer are formed to electrically contact with the magneto-conductive wire and at least one of the first and second patterned conductive layers respectively. Afterwards, a patterned circuit layer having a plurality of pads is formed on the dielectric layer, wherein each of pads electrically connects to one of the via plugs respectively.

According to the above embodiments of the present disclosure, an electromagnetic impedance sensing device can be manufactured by using semiconductor process technology. Firstly, a trench is formed on a surface of a substrate. Next, a first patterned conductive layer is formed on the surface of the substrate as well as a bottom surface and sidewalls of the trench. After a magneto-conductive wire is disposed in the trench, a second patterned conductive layer is formed on the first patterned conductive layer, wherein the second patterned conductive layer extends across the trench and electrically contacts with the first patterned conductive layer, so as to make the magneto-conductive wire sandwiched between the first patterned conductive layer and the second patterned conductive layer and to form at least one coil circuit surrounding the magneto-conductive wire by the first patterned conductive layer and the second patterned conductive layer.

During the process of manufacturing the electromagnetic impedance sensing device, the magneto-conductive wire is directly disposed in the trench of the substrate, hence the problem encountered in the conventional manufacturing process that the magneto-conductive wire is hard to fix can be resolved. Additionally, since the encapsulation layer is directly made of the insulation adhesive filled into the trench, additional steps for patterning the encapsulation layer can be omitted. Besides, due to the fixed magneto-conductive wire, the process for aligning the patterned conductive layer with the magneto-conductive wire is no more necessary; and the defocus problems of the photolithography process can be avoided by virtue of the fact that the step height existing between the magneto-conductive wire and the substrate can be eliminated by fixing the magneto-conductive wire in the trench and the subsequent process can be performed on a relatively flat surface. As a result, the process for manufacturing the electromagnetic impedance sensing device can be largely simplified, both manufacturing time and process difficulties can be reduced, process accuracy can be greatly increased, and the critical dimension of the electromagnetic impedance sensing device can further be miniaturized. The objects of reducing feature size, increasing the number of coils and enhancing device sensitivity can be also achieved. In addition, the aforementioned process can be applied by a wafer scaled process which allows multiple electromagnetic impedance sensing device being manufactured, packaged and tested on one single wafer, thus the process efficiency for manufacturing the electromagnetic impedance sensing devices can be greatly increased.

The above and other aspects of the present disclosure will become better understood with regard to the following detailed description of the preferred but non-limiting embodiment (s). The following description is made with reference to the accompanying drawings.

BRIEF DESCRIPTION OF THE DRAWINGS

FIG. 1D' is a top view of the process structure depicted in FIG. 1C.

FIG. 1G' is a top view of the process structure depicted in FIG. 1G.

FIG. 1H' is a top view of the electromagnetic impedance sensing element depicted in FIG. 1H.

DETAILED DESCRIPTION

The invention provides an electromagnetic impedance sensing device and a manufacturing method thereof. For the object, technical features and advantages of the present invention to be more easily understood by anyone ordinary skilled in the technology field, a number of exemplary embodiments are disclosed below with detailed descriptions and accompanying drawings. It should be noted that these embodiments are for exemplification purpose only, not for limiting the scope of protection of the invention. The invention can be implemented using other features, elements, methods and parameters. The preferred embodiments are merely for illustrating the technical features of the invention, not for limiting the scope of protection of. Anyone skilled in the technology field of the invention will be able to make suitable modifications or changes based on the specification disclosed below without breaching the spirit of the invention. Designations common to the accompanying drawings are used to indicate identical or similar elements.

Figure 1A:
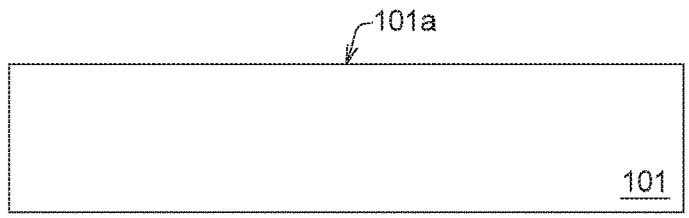
FIGS. 1A~1H are cross-sectional views illustrating the process for manufacturing an electromagnetic impedance sensing device according to an embodiment of the present disclosure.

FIGS. 1A~1H are cross-sectional views illustrating the process for manufacturing an electromagnetic impedance sensing device 100 according to an embodiment of the present disclosure. The manufacturing process of the electromagnetic impedance sensing device 100 includes following steps:

Refer to FIG. 1A. Firstly, a substrate 101 is provided. In some embodiments of the present disclosure, the substrate 101 can be made of a semiconductor material, a ceramic material, a plastic material or other materials suitable for carrying an electronic element. In some embodiments of the present disclosure, the substrate 101 can be made of a semiconductor material containing silicon (Si), silicon germanium (SiGe), gallium arsenide (GaAs), silicon carbide (SiC) or a combination thereof. In some other embodiments of the present disclosure, the substrate 101 can be realized by a carrying substrate, containing a plastic material or a ceramic material, such as printed circuit board (PCB) or flexible printed circuit (FPC) or realized by a ceramic substrate containing alumina. In the present embodiment, the substrate 101 preferably is realized by a silicon wafer.

Figure 1B:
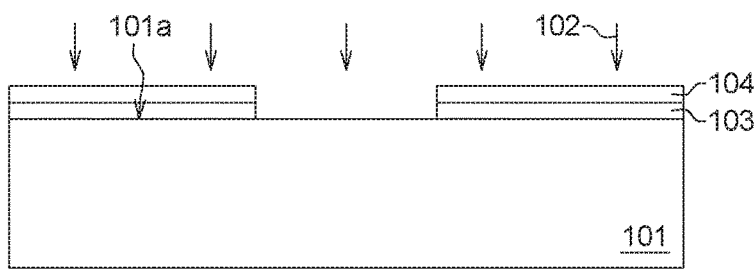

Next, a trench 105 is formed on a surface 101a of the substrate 101. In some embodiments of the present disclosure, the trench 105 can be formed on the surface 101a of the substrate 101 by way of etching, cutting, grinding, casting, molding or other possible methods. In the present embodiment, a silicon nitride hard mask layer 103 is firstly formed on the substrate 101 and then the silicon nitride hard mask layer 103 is patterned by a dry etching process 102, such as an inductively coupled plasma (ICP) etching process or a reactive ion etching (RIE) process, using the patterned photoresist layer 104 as an etching mask (as indicated in FIG. 1B). Then, a portion of the substrate 101 is removed by a wet etching process (not illustrated), for example using the patterned hard mask layer 103 as an etching mask and using an etching agent containing potassium hydroxide (KOH), to form the trench 105 on the surface 101a of the substrate 101 and extending downwards into the e substrate 101 from the surface 101a. In the present embodiment, the substrate 101 preferably is realized by a silicon wafer whose surface 101a has a lattice arrangement direction (1,0,0). In the wet etching process, the sidewalls 105a of the etched trench 105 and the surface 101a of the substrate 101 form an angle θ of 54.7° (as indicated in FIG. 1C).

After the hard mask layer 103 is removed, a patterned conductive layer 106 is formed on the surface 101a of the substrate 101 as well as the sidewalls 105a and a bottom surface 105b of the trench 105. Refer to FIG. 1D. In some embodiments of the present disclosure, the forming of the patterned conductive layer 103 includes following steps. Firstly, a metal layer containing copper (Cu), aluminum (Al), tungsten (W) or any combination thereof, is formed on the surface 101a of the substrate 101 as well as the sidewalls 105a and the bottom surface 105b of the trench 105 by a deposition process, such as a chemical vapor deposition process, a physical vapor deposition process or an electrolytic deposition process. Then, a part of the metal layer is removed by a lithography etching process. In the present embodiment, a copper layer is formed on the surface 101a of the substrate 101 as well as the sidewalls 105a and the bottom surface 105b of the trench 105 by an etching process. Then, the copper layer is patterned by a dry etching process, such as reactive ion etching (RIE) process to from a patterned conductive layer 106 on the surface 101a of the substrate 101 as well as the sidewalls 105a and the bottom surface 105b of the trench 105 (as indicated in FIG. 1D).

Figure 1C:
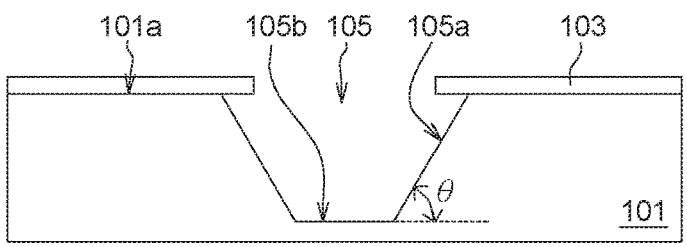
Figure 1D:
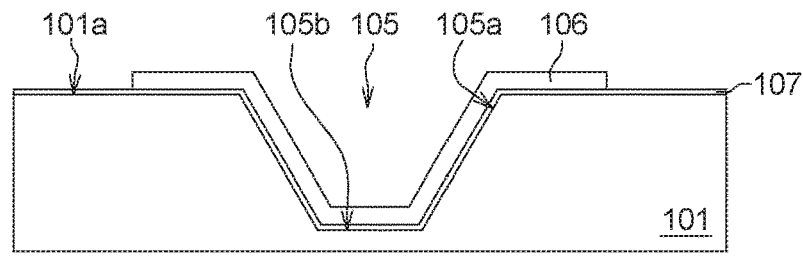
Figure 1D:
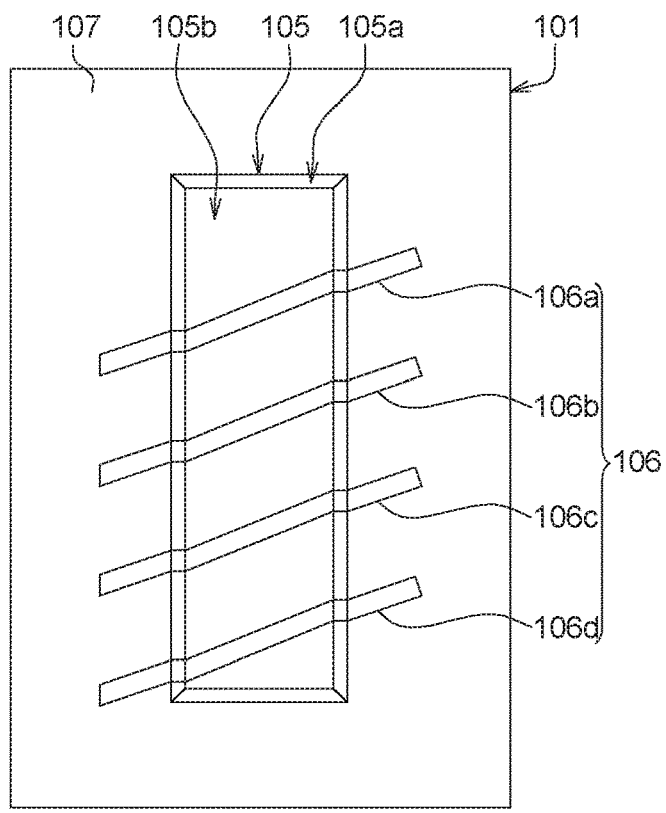

Referring to FIG. 1D', FIG. 1D' is a top view of the process structure depicted in FIG. 1C. In the present embodiment, the patterned conductive layer 106 includes a plurality of conductor strips, such as conductor strips 106a, 106b, 106c and 106d formed on the surface 101a of the substrate 101 mutually separated and respectively extending onto the sidewalls 105a and the bottom surface 105b of the trench 105 and further beyond two opposite sides of the trench 105. In other words, each of the conductor strips 106a, 106b, 106c and 106d extends across the trench 105. The two ends of the conductor strips 106a, 106b, 106c and 106d confomally cover the surface 101a of the substrate 101 connected to the two opposite sides of the trench 105 respectively. The middle part of the conductor strips 106a, 106b, 106c and 106d confomally cover the sidewalls 105a and the bottom surface 105b of the trench 105.

In should be noted that, in some embodiments of the present disclosure, before the patterned conductive layer 106 is formed, an insulating layer 107 is preferably formed on the surface 101a of the substrate 101 as well as the sidewalls 105a and the bottom surface 105b of the trench 105 by a deposition process or an oxidation process. In the present embodiment, the insulating layer 107 is realized by a silica (SiO2) layer formed by a chemical vapor deposition process and conformally covering the surface 101a of the substrate 101 (silicon wafer) as well as the sidewalls 105a and the bottom surface 105b of the trench 105 (as indicated in FIG. 1D).

After the patterned conductive layer 106 is formed, a magneto-conductive wire 108 is disposed on the trench 105 in a manner of electrically isolated from the patterned conductive layer 106. The magneto-conductive wire 108 can be made of an amorphous ferromagnetic material, an antiferromagnetic material, a non-ferromagnetic metal material, a tunnel oxide material or the arbitrary combinations thereof.

In some embodiments of the present disclosure, the magneto-conductive wire 108 can be made of a ferromagnetic material containing one of nickel (Ni), iron (Fe), cobalt (Co), and copper (Cu) or a ferromagnetic material containing the arbitrary combinations thereof. For example, the magneto-conductive wire 108 is made of a CoFeB-based alloy or a CoFeSiB-based alloy.

Figure 1E:
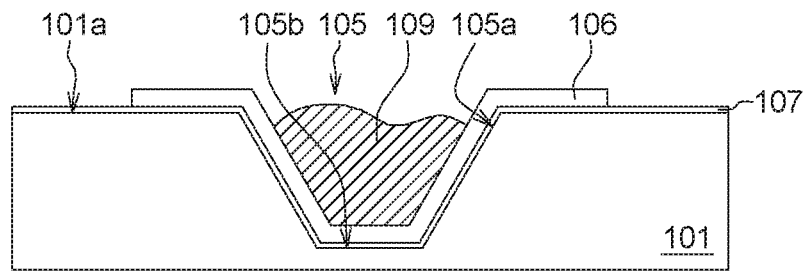

In the present embodiment, the magneto-conductive wire 108 can be made of a CoFeSiB base alloy, and the step of disposing the magneto-conductive wire 108 on the trench 105 includes following sub-steps: Firstly, an insulation adhesive 109, such as epoxy or other suitable insulating cement, is filled into the trench 105 (as indicated in FIG. 1E). Then, the magneto-conductive wire 108 is disposed in the trench 105. In some embodiments of the present disclosure, both the depth and the width of the trench 105 are substantially equivalent to or larger than the diameter of the magneto-conductive wire 108. Therefore, after the magneto-conductive wire 108 is disposed in the trench 105, the insulation adhesive 109 previously filled into the trench 105 will completely cover the magneto-conductive wire 108, such that the magneto-conductive wire 108 is electrically isolated from the portion of the patterned conductive layer 106 that is disposed on the sidewalls 105a and the bottom surface 105b of the trench 105. In some exemplary embodiments of the present disclosure, the aspect ratio of the trench 105 substantially ranges from 2.00 to 2.50, and the ratio of the depth of the trench 105 to the diameter of the magneto-conductive wire 108 substantially ranges from 1.20 to 1.30.

In previous embodiments, the insulation adhesive 109 is filled into the trench 105 before the magneto-conductive wire 108 is disposed in the trench 105. However, the step sequences are not limited to this regards, in other embodiments of the present disclosure the insulation adhesive 109 can be filled into the trench 105 after the magneto-conductive wire 108 is disposed in the trench 105. In some embodiments of the present disclosure, the trench 105 is not fulfilled by the insulation adhesive 109. In other embodiments, the trench 105 is preferably substantially filled by the insulation adhesive 109.

Figure 1F:
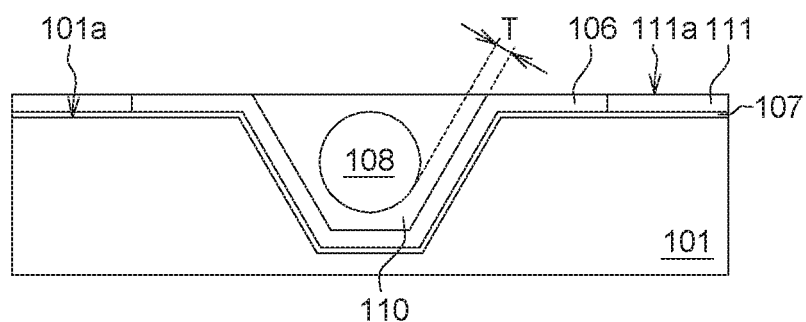

Afterwards, the insulating material 109 covering the magneto-conductive wire 108 can be cured by way of heat baking or light exposure to form an encapsulation layer 110 completely encapsulating the sidewalls of the magneto-conductive wire 108 along a direction parallel to the long axil of the magneto-conductive wire 108 and separating the patterned conductive layer 106 from the magneto-conductive wire 108. In some exemplary embodiments of the present disclosure, the encapsulation layer 110 used to separate the sidewalls of the magneto-conductive wire 108 from the patterned conductive layer 106 has a thickness T of at least 0.5 μm. Moreover, after the encapsulation layer 110 is formed, an optional planarization process can be selectively performed. For example, a planarizing layer 111 can be formed on the surface 101 of the substrate 101 to cover the patterned conductive layer 106 and the encapsulation layer 110. Then, portions of the planarizing layer 111 and the encapsulation layer 110 are removed by a chemical mechanical polishing (CMP) process, using the patterned conductive layer 106 as a stopping layer, to form a planrized surface 111a substantially coplanar with the encapsulation layer 110 and the patterned conductive layer 106 (as indicated in FIG. 1F).

Figure 1G:
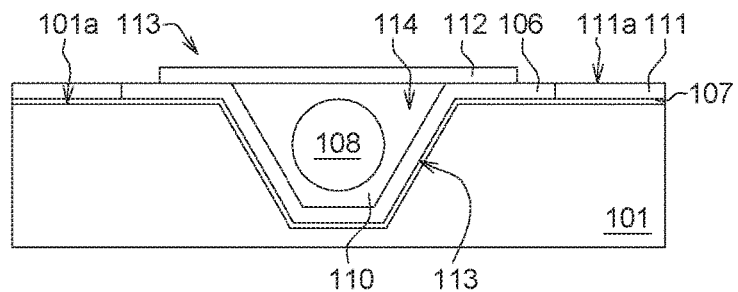
Figure 1G:
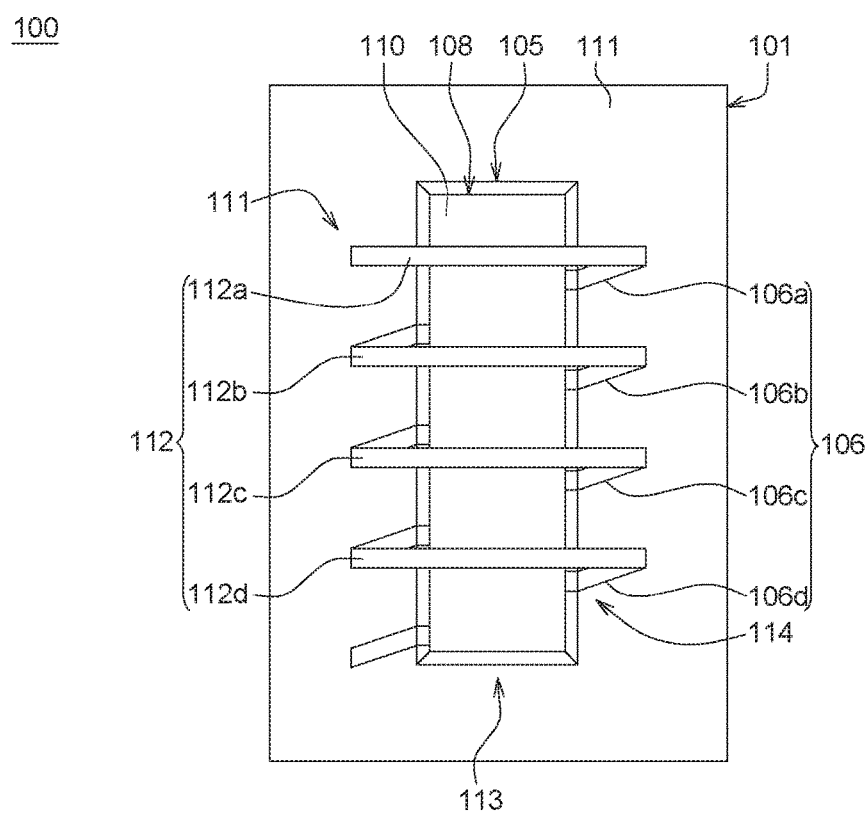

Then, a patterned conductive layer 112 is formed on the encapsulation layer 110, the patterned conductive layer 106 and the planrized surface 111a to make the patterned conductive layer 112 extending across the trench 105 and electrically in contact with the patterned conductive layer 106, whereby the magneto-conductive wire 108 is sandwiched between the patterned conductive layer 106 and the patterned conductive layer 112, and at least one coil circuit 113 surrounding the magneto-conductive wire 108 (as indicated in FIG. 1G) is formed between the patterned conductive layer 106 and the patterned conductive layer 112. Since the material and method used for forming the patterned conductive layer 112 are identical or similar to that used for forming the patterned conductive layer 106, thus the similarities are not redundantly repeated here.

Referring to FIG. 1G', FIG. 1G' is a top view of the process structure depicted in FIG. 1G. In the present embodiment, the patterned conductive layer 112 includes a plurality of conductor strips, such as conductor strips 112a, 112b, 112c and 112d, mutually separated and formed on the encapsulation layer 110, the patterned conductive layer 106 and the planrized surface 111a, and each of the conductor strips 112a, 112b, 112c and 112d extends across the trench 105 underneath the patterned conductive layer 112. One end of the conductor strip 112a of the patterned conductive layer 112 contacts to one end of the conductor strip 106a of the patterned conductive layer 106. The other end of the conductor strip 106a of the patterned conductive layer 106 contacts to one end of the conductor strip 112b of the patterned conductive layer 112. The other end of the conductor strip 112b of the patterned conductive layer 112 contacts to one end of the conductor strip 106b of the patterned conductive layer 106. The other end of the conductor strip 106b of the patterned conductive layer 106 contacts to one end of the conductor strip 112c of the patterned conductive layer 112. The other end of the conductor strip 112c of the patterned conductive layer 112 contacts to one end of the conductor strip 106c of the patterned conductive layer 106. The other end of the conductor strip 106c of the patterned conductive layer 106 contacts to one end of the conductor strip 112d of the patterned conductive layer 112. The other end of the conductor strip 112d of the patterned conductive layer 112 contacts to one end of the conductor strip 106d of the patterned conductive layer 106. The portions of the conductor strips 106a, 106b, 106c and 106d disposed on the sidewalls 108a and the bottom surface 108b of the trench 108 and the portions of the conductor strips 112a, 112b, 112c and 112d crossing over the trench 108 can define an accommodation space 114, through which the magneto-conductive wire 108 passes, and together form at least one coil circuit 113 surrounding the magneto-conductive wire 108.

When the external magnetic field applied to the magneto-conductive wire 108 changes, current pulse axially passing through the magneto-conductive wire 108 may occur, an induced voltage may be output by the coil circuit 113 correspondingly, and the change in the external magnetic field can thus be determined. The direction of the current pulse axially flowing through the magneto-conductive wire 108 is reverse to the direction of the current flowing through the coil circuit 113.

Subsequently, a planarized dielectric layer 115 can be formed on the surface 101a of the substrate 101 and conformally covering the patterned conductive layers 106 and 112 and planarized surface 111a. A plurality of vis plugs, such as via plugs 116a, 116b, 116c and 116d, are formed respectively penetrating the dielectric layer 115 and electrically in contact with the magneto-conductive wire 108 as well as at least one of the patterned conductive layer 106 and 112. In the present embodiment, the via plugs 116a and 116b electrically contact to the conductor strip 112a of the patterned conductive layer 112 and the conductor strip 106d of the patterned conductive layer 106, respectively; the contact windows 116c and 116d electrically contact to the two ends of the magneto-conductive wire 108, respectively.

Then, a patterned circuit layer 117 is formed on the dielectric layer 115, wherein the patterned circuit layer 117 includes a plurality of pads, such as solder pads 117a, 117b, 117c and 117d, and each of the solder pads 117a, 117b, 117c and 117d is electrically connected to one of the via plugs 116a, 116b, 116c and 116d correspondingly. Meanwhile the preparation of the electromagnetic impedance sensing device 100 (as indicated in FIG. 1H) is completed.

Figure 1H:
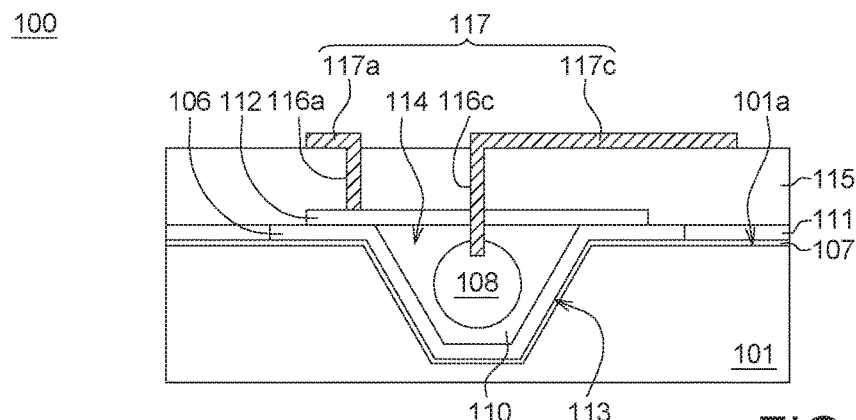
Figure 1H:
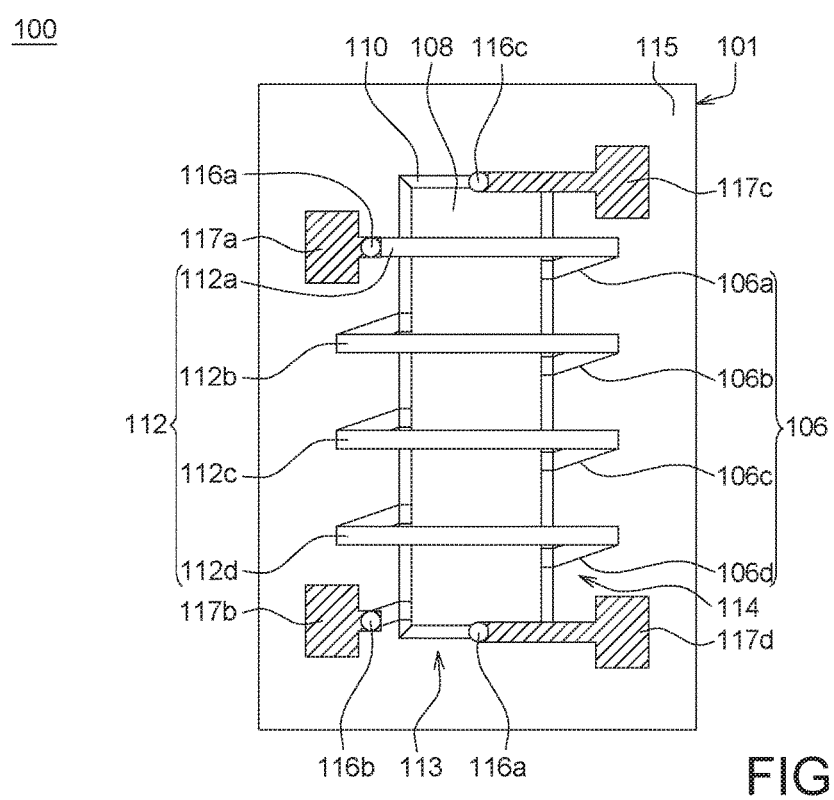

Referring to FIG. 1H', FIG. 1H' is a top view of the electromagnetic impedance sensing device 100 of FIG. 1H is shown. The electromagnetic impedance sensing device 100 at least includes a substrate 101, a patterned conductive layer 106, a patterned conductive layer 112, a magneto-conductive wire 108 and an encapsulation layer 110. The substrate 101 has a surface 101a and a trench 105 extending into the substrate 101 from the surface 101a. The patterned conductive layer 106 is disposed on the surface 101a of the substrate 101 as well as sidewalls 105a and a bottom surface 105b of the trench 105. The magneto-conductive wire 108 is disposed in the trench 105. The patterned conductive layer 112 is disposed on the patterned conductive layer 106 extends across the trench 105 and electrically contacts with the patterned conductive layer 106, so as to make the magneto-conductive wire 108 sandwiched between the patterned conductive layer 106 and the patterned conductive layer 112. The encapsulation layer 110 encapsulates the magneto-conductive wire 108 to make the magneto-conductive wire 108 electrically isolated from the patterned conductive layer 106 and the patterned conductive layer 112, At least one coil circuit 113 surrounding the magneto-conductive wire 108 are formed by the patterned conductive layer 106 and the patterned conductive layer 112.

According to the above embodiments of the present disclosure, an electromagnetic impedance sensing device 100 can be manufactured by using semiconductor process technology. Firstly, a trench 105 is formed on a surface 101a of a substrate 101. Next, a first patterned conductive layer 106 is formed on the surface 101a of the substrate 101 as well as a bottom surface 105a and sidewalls 105b of the trench 105. After a magneto-conductive wire 108 is disposed in the trench 105, a second patterned conductive layer 112 is formed on the first patterned conductive layer 106, wherein the second patterned conductive layer 112 extends across the trench 105 and electrically contacts with the first patterned conductive layer 106, so as to make the magneto-conductive wire 108 sandwiched between the first patterned conductive layer 106 and the second patterned conductive layer 108 and to form at least one coil circuit 113 surrounding the magneto-conductive wire 108 by the first patterned conductive layer 106 and the second patterned conductive layer 112.

During the process of manufacturing the electromagnetic impedance sensing device 100, the magneto-conductive wire 108 is directly disposed in the trench 105 of the substrate 101, hence the problem encountered in the conventional manufacturing process that the magneto-conductive wire 108 is hard to fix can be resolved. Additionally, since the encapsulation layer 110 is directly made of the insulation adhesive filled into the trench 105, additional steps for patterning the encapsulation layer 110 can be omitted. Besides, due to the fixed magneto-conductive wire 108, the processes for aligning the patterned conductive layers 106 and 112 with the magneto-conductive wire 108 are no more necessary; and the defocus problems of the photolithography process can be avoided due to the fact that the step height existing between the magneto-conductive wire 108 and the substrate 101 can be eliminated by fixing the magneto-conductive wire 108 in the trench 105 and the subsequent process can be performed on a relatively flat surface. As a result, the process for manufacturing the electromagnetic impedance sensing device 100 can be largely simplified, both manufacturing time and process difficulties can be reduced, process accuracy can be greatly increased, and the critical dimension of the electromagnetic impedance sensing device can further be miniaturized. The feature size can be scaled down, for example, the pitch/width of the coil circuit 113 can be shrunk down to about 3 µm, and the objects of increasing the number of coil circuit 113 and enhancing device sensitivity can be also achieved. In addition, the aforementioned process can be applied by a wafer scaled process which allows multiple electromagnetic impedance sensing device 100 being manufactured, packaged and tested on one single wafer, thus the process efficiency for manufacturing the electromagnetic impedance sensing devices 100 can be greatly increased.

It will be apparent to those skilled in the art that various modifications and variations are made to the disclosed embodiments. It is intended that the specification and examples be considered as exemplary only, with a true scope of the disclosure being indicated by the following claims and their equivalents.

What is claimed is:

1. An electromagnetic impedance sensing device, comprising:
   a substrate having a surface and a trench extending into the substrate from the surface;
   a first patterned conductive layer disposed on the surface of the substrate as well as a bottom surface and sidewalls of the trench;
   a magneto-conductive wire disposed in the trench;
   a second patterned conductive layer formed on the first patterned conductive layer, extending across the trench and electrically in contact with the first patterned conductive layer, so as to make the magneto-conductive wire sandwiched between the first patterned conductive layer and the second patterned conductive layer;
   an encapsulation layer encapsulating the magneto-conductive wire to make the magneto-conductive wire electrically isolated from the first patterned conductive layer and the second patterned conductive layer, respectively;
   wherein the first patterned conductive layer and the second patterned conductive layer form at least one coil circuit surrounding the magneto-conductive wire,
   a dielectric layer conformally covering the first patterned conductive layer and the second patterned conductive layer;
   a plurality of via plugs penetrating the dielectric layer and electrically in contact with the magneto-conductive wire and at least one of the first patterned conductive layer and the second patterned conductive layer; and
   a patterned circuit layer having a plurality of pads formed on the dielectric layer, wherein each of the pads is electrically connected to one of the via plugs.

2. The electromagnetic impedance sensing device according to claim 1, wherein the substrate is made of a semiconductor material, and the electromagnetic impedance sensing device further comprises an insulating layer disposed between the substrate and the first patterned conductive layer.

3. The electromagnetic impedance sensing device according to claim 1, wherein the trench is filled by the encapsulation layer to electrically isolate the magneto-conductive wire from the first patterned conductive layer and the second patterned conductive layers respectively.

4. A manufacturing method of an electromagnetic impedance sensing device, comprising:
   providing a substrate having a surface and a trench extending into the substrate from the surface;
   forming a first patterned conductive layer on the surface of the substrate as well as a bottom surface and sidewalls of the trench;
   disposing a magneto-conductive wire in the trench;
   forming an encapsulation layer encapsulating the magneto-conductive wire;
   forming a second patterned conductive layer on the first patterned conductive layer, wherein the second patterned conductive layer extends across the trench and electrically contacts the first patterned conductive layer, so as to make the magneto-conductive wire sandwiched between the first patterned conductive layer and the second patterned conductive layer, and to form at least one coil of wire surrounding the magneto-conductive wire by the first patterned conductive layer and the second patterned conductive layer;
   forming a dielectric layer conformally covering the first patterned conductive layer and the second patterned conductive layer;
   forming a plurality of via plugs penetrating the dielectric layer and electrically in contact with the magneto-conductive wire and at least one of the first patterned conductive layer and the second patterned conductive layer respectively; and
   forming a patterned circuit layer having a plurality of pads on the dielectric respectively layer, wherein each of the pads electrically connects to one of the via plugs.

5. The manufacturing method of an electromagnetic impedance sensing device according to claim 4, wherein before the magneto-conductive wire is disposed in the trench, the method further comprises filling an insulating material into the trench to at least encapsulate a portion of the magneto-conductive wire, so as to make the magneto-conductive wire electrically isolated from a portion of the first patterned conductive layer that is disposed on the sidewalls and the bottom surface of the trench.

6. The manufacturing method of an electromagnetic impedance sensing device according to claim 5, wherein before the second patterned conductive layer is formed, the method further comprises filling the trench with the insulating material.

7. The manufacturing method of an electromagnetic impedance sensing device according to claim 4, wherein the substrate is made of a semiconductor material, and before the first patterned conductive layer is formed, the method further comprises forming an insulating layer on the substrate.

* * * * *